(12) United States Patent
Miyaura

(10) Patent No.: US 6,176,432 B1
(45) Date of Patent: Jan. 23, 2001

(54) MODULATING AND DEMODULATING DEVICE

(75) Inventor: Masao Miyaura, Fukushima-ken (JP)

(73) Assignee: Alps Electric Co., Ltd., Tokyo (JP)

( * ) Notice: Under 35 U.S.C. 154(b), the term of this patent shall be extended for 0 days.

(21) Appl. No.: 09/253,444

(22) Filed: Feb. 19, 1999

(30) Foreign Application Priority Data

Mar. 9, 1998 (JP) .................................................. 10-056754

(51) Int. Cl.[7] .................................................. G06K 19/00
(52) U.S. Cl. .......................................... 235/487; 235/375
(58) Field of Search .................................... 235/492, 487, 235/375, 380, 493, 491, 384; 455/126

(56) References Cited

U.S. PATENT DOCUMENTS

| | | |
|---|---|---|
| 3,582,828 | 6/1971 | Brockman . |
| 5,173,705 * | 12/1992 | Camaide et al. ........................ 342/42 |
| 5,280,633 * | 1/1994 | Camaide et al. .................... 455/84 X |
| 5,305,469 * | 4/1994 | Camiade et al. ........................ 455/78 |
| 5,410,729 * | 4/1995 | Kumagai et al. ................. 455/126 X |
| 5,642,103 * | 6/1997 | Tokuda et al. .................... 235/380 X |
| 5,661,757 | 8/1997 | Takahashi et al. . |

FOREIGN PATENT DOCUMENTS

| | | |
|---|---|---|
| 0 362 583 A1 | 4/1990 | (EP) . |
| 0 473 981 A2 | 3/1992 | (EP) . |
| PCT/DE95/ 00403 | 10/1995 | (WO) . |

OTHER PUBLICATIONS

Chan T.K. et al., Design of the Microwave Transponder for Automatic Debiting Systems, pp. 1025–1029, (No Date).

* cited by examiner

*Primary Examiner*—Karl D. Frech
(74) *Attorney, Agent, or Firm*—Brinks Hofer Gilson & Lione

(57) ABSTRACT

The modulating and demodulating device comprises a microstrip line network connected to a transmitting/receiving antenna, the modulator-demodulator having first and second diodes connected to an output of the microstrip line network, and a bias voltage supplying circuit for supplying a bias voltage selectively to the first and second diodes. In the modulator-demodulator, the first diode is connected between the input and output terminals, and the second diode is connected between the input terminal and a reference potential point. When the modulator-demodulator executes a modulating operation, the bias voltage supplying circuit supplies a bias voltage to turn on both the first and second diodes or a bias voltage to turn on only the first diode in accordance with a modulation signal. When the modulator-demodulator executes a demodulating operation, the bias voltage supplying circuit supplies a bias voltage to turn off both the first and second diodes.

2 Claims, 3 Drawing Sheets

| | SWITCH | | | TERMINAL VOLTAGE | | MODULATION/ DEMODULATION STATE |
|---|---|---|---|---|---|---|
| | 19 | 20 | 21 | 23 | 24 | 2 |
| A | — | — | OFF | 0ᵛ | 0ᵛ | DEMODULATION |
| B | ON | OFF | ON | 0ᵛ | 5ᵛ | MODULATION, PHASE SHIFT OF 0° |
| C | OFF | ON | ON | 5ᵛ | 0ᵛ | MODULATION, PHASE SHIFT OF 180° |

MODULATING AND DEMODULATING DEVICE

BACKGROUND OF THE INVENTION

1. Field of the Invention

The present invention relates to a modulating and demodulating device and, more particularly, to a modulating and demodulating device for use in a transmitter-receiver which comprises a modulator-demodulator (circuit) for performing a modulating or demodulating operation in accordance with a bias voltage to be supplied to diodes, transmits a signal at the time of the modulating operation and receives a signal at the time of the demodulating operation.

2. Related Art

At present, an automatic toll collecting (ATC) system has been being developed. According to the system, a roadside device is arranged on a toll facility side as means for collecting a toll of a toll road, an on-vehicle device is mounted on a vehicle, required radio waves are transmitted and received between the roadside device and the on-vehicle device when the vehicle stops at the toll facility, and a toll is collected by wireless means. Various tests are being carried out in order to put the system to practical use.

FIG. 3 is a block diagram showing a construction of an important part of a roadside device for use in the automatic toll collecting system. FIG. 4 is a block diagram showing a construction of an important part of an on-vehicle device for use in the automatic toll collecting system.

FIG. 5 is a circuit construction diagram showing a specific example of a construction of the on-vehicle device shown in FIG. 4. In FIG. 5, the same component elements as those shown in FIG. 4 are designated by the same reference numerals.

As shown in FIG. 3, the roadside device arranged on the toll facility side comprises an RF receiving filter 31, an RF receiving amplifier 32, a frequency converter 33, an IF (intermediate frequency) amplifier 34, an IF (intermediate frequency) filter 35, a local oscillator 36, first and second buffer amplifiers 37 and 38, a switch 39, an FM encoder 40, an RF transmitting amplifier 41, an RF transmitting filter 42, a receiving antenna 43, a transmitting antenna 44, a demodulation signal output terminal 45, and a modulation signal input terminal 46.

In this case, in the RF receiving filter 31, the input terminal is connected to the receiving antenna 43 and the output terminal is connected to the input terminal of the RF receiving amplifier 32. In the frequency converter 33, a first input terminal is connected to the output terminal of the RF receiving amplifier 32, a second input terminal is connected to the output terminal of the first buffer amplifier 37, and the output terminal is connected to the input terminal of the IF amplifier 34. In the IF filter 35, the input terminal is connected to the output terminal of the IF amplifier 34 and the output terminal is connected to the demodulation signal output terminal 45. The local oscillator 36 includes an oscillator, a phase locked loop, a quartz oscillator, a frequency multiplying circuit, and an output buffer amplifier (all of which are not shown in the diagram). The output terminal of the local oscillator 36 is connected to both the input terminal of the first buffer amplifier 37 and the input terminal of the second buffer amplifier 38. In the switch 39, the input terminal is connected to the output terminal of the second buffer amplifier 38, the output terminal is connected to the input terminal of the RF transmitting amplifier 41, and the control terminal is connected to the output terminal of the FM encoder 40. The input terminal of the FM encoder 40 is connected to the modulation signal input terminal 46. The input terminal of the RF transmitting filter 42 is connected to the output terminal of the RF transmitting amplifier 41 and the output terminal is connected to the transmitting antenna 44.

As shown in FIG. 4, the on-vehicle device to be mounted on a vehicle comprises a microstrip line (MSL) network 47, a modulator-demodulator 48, a diode 48D, a bias voltage supplying circuit 49, an FM decoder 50, a transmitting/receiving antenna 51, a demodulation signal output terminal 52, and a change-over signal supplying terminal 53.

In this case, the input terminal of the microstrip line network 47 is connected to the transmitting/receiving antenna 51 and the output terminal is connected to the input terminal of the modulator-demodulator 48. In the modulator-demodulator 48, the diode 48D is serially connected between the input and output terminals, the output terminal is connected to the input terminal of the FM decoder 50, and the control terminal is connected to the output terminal of the bias voltage supplying circuit 49. The input terminal of the bias voltage supplying circuit 49 is connected to the change-over signal supplying terminal 53. The output terminal of the FM decoder 50 is connected to the demodulation signal output terminal 52.

Further, as shown in FIG. 5, the microstrip line network 47 has first to third microstrip lines 47A, 47B, and 47C. The modulator-demodulator 48 has, besides the diode 48D, a first inductor 48A, a second inductor 48C, a resistor 48C, and a bias voltage supplying terminal 48E. The bias voltage supplying circuit 49 has a switch 49A and a power source 49B. In FIG. 5, a control unit 54 which is not shown in FIG. 4 is provided.

In the microstrip line network 47, the first microstrip line 47A is serially connected between the input and output terminals, the secondmicrostrip line 47B is connected between the input terminal and the reference potential (ground) point, and the third microstrip line 47C is connected between the output terminal and the reference potential (ground) point. In the modulator-demodulator 48, the diode 48D is serially connected between the input and output terminals, the first inductor 48A and the resistor 48C are serially connected between the input terminal and the bias voltage supplying terminal 48E, and the second inductor 48C is connected between the output terminal and the ground terminal. In the bias voltage supplying circuit 49, one terminal of the switch 49A is connected to the output terminal of the bias voltage supplying circuit 49, another terminal is connected to the ground terminal via the power source 49B, and the control terminal is connected to the change-over signal supplying terminal 53. The control unit 54 is connected to the FM decoder 50 and the change-over signal supplying terminal 53.

Modes of transmitting and receiving signal waves between the roadside device and the on-vehicle device in the automatic toll collecting system having the above construction will be generally described as follows with reference to FIGS. 3 to 5.

First, a first operating mode of transmitting signal waves from the roadside device side to the on-vehicle device side will be described.

In the first operating mode, on the roadside device side, the FM encoder 40 operates in response to a modulation signal supplied to the modulation signal input terminal 46, and the switch 39 is turned on and off according to a signal encoded by the FM encoder 40. At this time, a carrier signal generated from the local oscillator 36 is subjected to amplitude shift keying (ASK) modulation by the on-off control by the switch 39, thereby forming an ASK modulated signal. Subsequently, after the ASK modulated signal is amplified by the RF transmitting amplifier 41 to a required level, unnecessary frequency components are eliminated by the RF transmitting filter 42, and the resultant signal is transmitted from the transmitting antenna 44.

In the first operating mode, the on-vehicle device receives the ASK modulated signal transmitted from the roadside device. An un-modulated signal is supplied from the control unit 54 to the change-over signal supplying terminal 53. By the supply of the un-modulated signal, the switch 49A of the bias voltage supplying circuit 49 is turned off, an output of the power source 49B is cut off by the switch 49A, the bias voltage supplying terminal 48E in the modulator-demodulator 48 is zero biased, and the diode 48D in the modulator-demodulator 48 is also zero biased. At this moment, when the signal waves from the roadside device are received by the transmitting/receiving antenna 51, the reception signal is supplied to the modulator-demodulator 48 via the microstrip line network 47, the ASK modulated signal is demodulated by the diode 48D, and an encoded signal led from the modulator-demodulator 48 is supplied to the FM decoder 50. The FM decoder 50 decodes the encoded signal, reproduces the original signal, and the resultant signal is supplied from the demodulation signal output terminal 52 to an adopted circuit (not shown).

A second operating mode of transmitting signal waves from the roadside device side to the on-vehicle device side and, in response to the transmission, transmitting signal waves from the on-vehicle device side to the roadside device side will now be described.

In the second operating mode, on the roadside device side, the FM encoder 40 generates an encoded signal having a unipolar pulse in response to an un-modulated signal supplied to the modulation signal input terminal 46 to maintain the switch 39 in the ON state. At this time, a carrier signal generated from the local oscillator 36 is supplied to the RF transmitting amplifier 41 through the switch 39 and is amplified to a required level by the RF transmitting amplifier 41. After that, unnecessary frequency components are eliminated by the RF transmitting filter 42, and a resultant signal is transmitted from the transmitting antenna 44.

In the second operating mode, the on-vehicle device receives the carrier signal transmitted from the roadside device and transmits a PSK modulated signal obtained by executing the phase shift keying (PSK) modulation to the carrier signal to the roadside device side. A binary modulation signal is supplied from the control unit 54 to the change-over signal supplying terminal 53 and the switch 49A in the bias voltage supplying circuit 49 is turned on or off in accordance with the supply of the binary modulation signal. When the switch 49A is ON, an output voltage of, for example, 5V of the power source 49B is supplied to the bias voltage supplying terminal 48E in the modulator-demodulator 48 and a forward voltage of 5V is applied to the diode 48D in the modulator-demodulator 48. On the other hand, when the switch 49A is OFF, the output voltage of the power source 49B is cut off by the switch 49A and the diode 48D is zero biased. At this moment, when the signal waves including the un-modulated carrier signal from the roadside device are received by the transmitting/receiving antenna 51, the reception signal is supplied to the modulator-demodulator 48 via the microstrip line network 47. The modulator-demodulator 48 performs a phase shift of 180° between the phase of the un-modulated carrier signal when the forward voltage of 5V is applied to the diode 48D and that of the un-modulated carrier signal when zero bias is applied to the diode 48D, that is, executes the PSK modulation. After that, the obtained PSK modulated signal is transferred to the transmitting/receiving antenna 51 via the microstrip line network 47 and is transmitted from the transmitting/receiving antenna 51.

In the second operating mode, when the signal waves including the PSK modulated signal transmitted from the on-vehicle device side are received by the receiving antenna 43 on the roadside device side, after unnecessary frequency components in the reception signal are eliminated by the RF receiving filter 31, the resultant signal is amplified by the RF receiving amplifier 32 to a required level, and the amplified signal is supplied to the frequency converter 33. The frequency converter 33 frequency-mixes the reception signal with a local oscillation signal supplied from the local oscillator 36, thereby generating an intermediate frequency signal. The intermediate frequency signal is amplified to a required level by the IF amplifier 34. After that, unnecessary frequency components are eliminated by the IF filter 35 and a resultant signal is supplied to an adopted circuit (not shown) including a PSK modulation signal demodulator via the demodulation signal output terminal 45.

According to the modulating and demodulating device comprising the microstrip line network 47, the modulator-demodulator 48, and the bias voltage supplying circuit 49 arranged on the on-vehicle device side, in the first operating mode, when the diode 48D in the modulator-demodulator 48 is zero biased and a reception signal including the ASK modulated signal received by the transmitting/receiving antenna 51 is ASK demodulated by the diode 48D in the modulator-demodulator 48, the level of the demodulated signal is lower than the level of the reception signal (ASK modulated signal) received by the transmitting/receiving antenna 51 by 3 dB, that is, the half of the electric power of the reception signal is consumed at the time of ASK demodulation. Consequently, there is a problem such that the reception signal cannot be ASK demodulated with high efficiency.

In the second operating mode, the modulating and demodulating device disposed on the on-vehicle device side turns on or off the diode 48D by a modulation signal, executes the PSK modulation by performing a phase shift of 180° between the phase of the carrier signal received by the transmitting/receiving antenna 51 when the diode 48D is ON and that of the carrier signal when the diode 48D is OFF. When the obtained PSK modulated signal is reflected by the modulator-demodulator 48 and is transmitted from the transmitting/receiving antenna 51, the level of the PSK modulated signal reflected by the modulator-demodulator 48 is lower than the level of the reception signal by 3 dB, that is, the half of the electric power of the reception signal is consumed at the time of the PSK modulation. Consequently, there is a problem such that the reception signal cannot be PSK modulated with high efficiency.

SUMMARY OF THE INVENTION

The invention is to solve the problems and its object is to provide a modulating and demodulating device which realizes not only high-efficient demodulation of a reception signal but also high-efficient modulation of a reception signal by improving a modulator-demodulator circuit.

In order to achieve the object, a modulating and demodulating device according to the invention comprises a microstrip line network, a modulator-demodulator having a serially connected first diode and a shunt-connected second diode, and a bias voltage supplying circuit. The bias voltage supplying circuit has means for supplying a bias voltage to turn on the first and second diodes and a bias voltage to turn on only the first diode in accordance with a modulation signal at the time of modulating operation of the modulator-demodulator, and for supplying a bias voltage to turn off both the first and second diodes at the time of demodulating operation of the modulator-demodulator.

According to the means, at the time of demodulation of the received signal waves, both the first and second diodes in the modulator-demodulator are turned off and an ASK modulation signal received by the first diode is demodulated, thereby obtaining a demodulated output. At the time of modulation of the received signal waves, both the first and second diodes or only the first diode in the modulator-demodulator are/is turned on in accordance with a binary modulation signal, thereby obtaining a PSK modulation signal according to the binary modulation signal, and the PSK modulation signal is transmitted. Consequently, the power consumed by the first diode when the signal waves are demodulated can be reduced. Moreover, the power consumed by the first and second diodes when the signal waves are modulated can be also similarly reduced. Thus, high-efficient signal demodulation and modulation can be carried out.

In a mode for carrying out the present invention, a modulating and demodulating device comprises: a microstrip line network connected to a transmitting/receiving antenna; a modulator-demodulator having a first diode and a second diode, which is connected to an output of the microstrip line network; and a bias voltage supplying circuit for supplying a bias voltage selectively to the first and second diodes. In the modulator-demodulator, the first diode is serially connected between the input and output terminals, and the second diode is shunt-connected between the input terminal and a reference potential point. When the modulator-demodulator executes a modulating operation, the bias voltage supplying circuit supplies a bias voltage to turn on both of the first and second diodes or a bias voltage to turn on only the first diode in accordance with a modulation signal. When the modulator-demodulator executes a demodulating operation, the bias voltage supplying circuit supplies a bias voltage to turn off both the first and second diodes.

In a specific example of the mode of carrying out the invention, the modulating and demodulating device is used for an on-vehicle transmitter-receiver for an automatic toll collecting system.

According to embodiments of the invention, in case of demodulating received signal waveforms including an ASK modulated signal, a bias voltage generated by the bias voltage supplying circuit is cut off to turn off both the first and second diodes in the modulator-demodulator, and the received ASK modulation signal is demodulated by the first diode, thereby obtaining a demodulated output. On the other hand, in case of modulating received signal waves including an un-modulated carrier signal, two bias voltages of a predetermined voltage and zero voltage are generated by the bias voltage supplying circuit in accordance with binary modulation signals, it is switched between turn-on of both the first and second diodes in the modulator-demodulator and turn-on of only the first diode in accordance with the two bias voltages, a PSK modulated signal whose phase is shifted according to the switching of the ON state of the first and/or second diodes is generated, and the obtained PSK modulated signal is reflected by the modulator-demodulator and is transmitted.

As mentioned above, according to the modes of carrying out the invention, the modulator-demodulator is provided with not only the first diode but also the second diode. At the time of demodulation of signal waves, the first and second diodes are turned off. At the time of modulation of signal waves, both of the first and second diodes or only the first diode are/is turned on in accordance with the binary modulation signal. At the time of demodulation of the signal waves, therefore, the power consumed by the first diode when the ASK modulated signal is demodulated is reduced, so that the ASK demodulation can be performed with high efficiency. Moreover, at the time of modulation of the signal waves, the power consumed by the first and second diodes when the PSK modulation is executed is reduced, so that the high-efficient PSK modulation can be carried out.

DETAILED DESCRIPTION OF THE PREFERRED EMBODIMENTS

An embodiment of the invention will be described hereinbelow with reference to the drawings.

Figure 1:
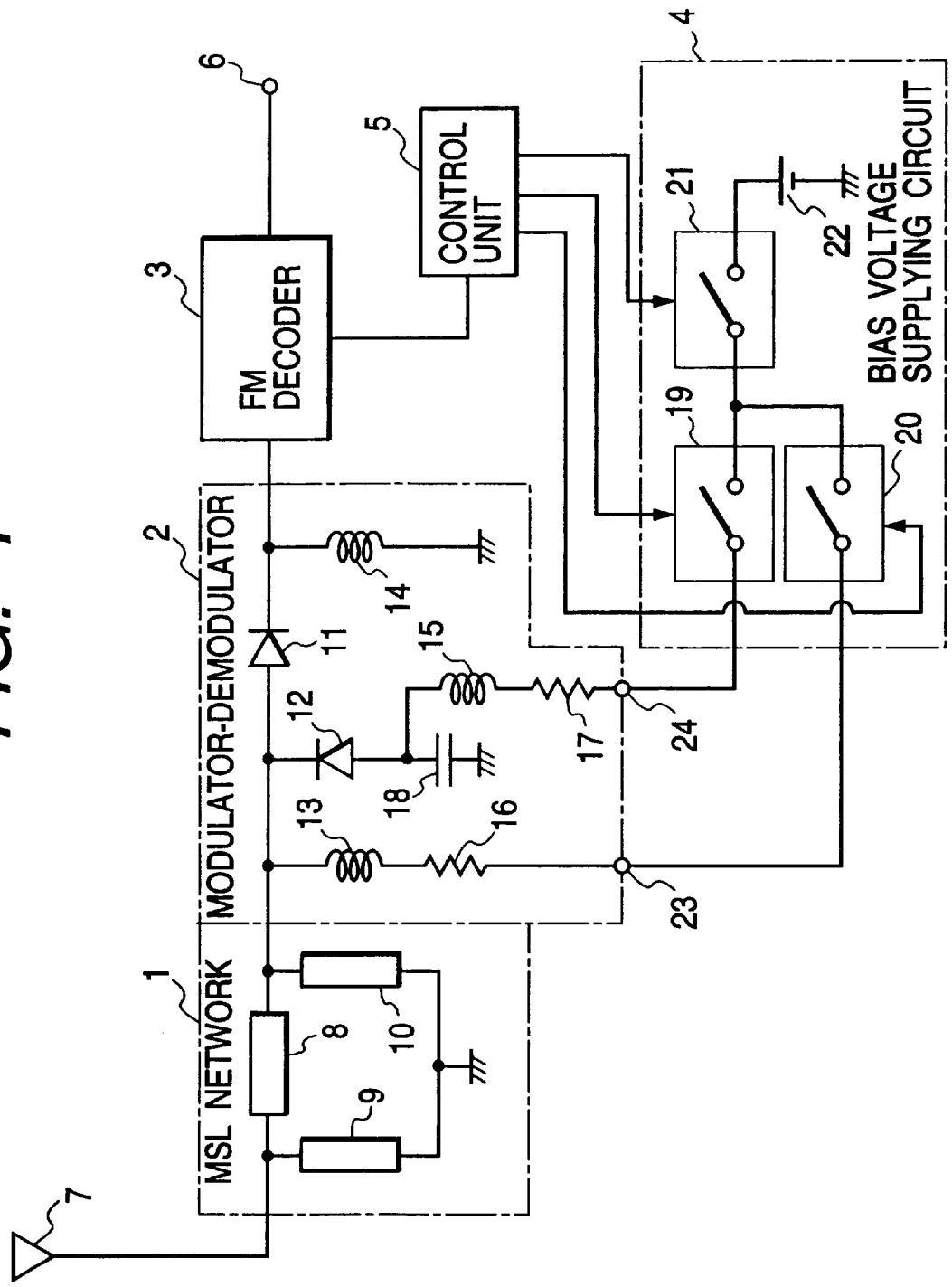
FIG. 1 is a circuit diagram showing a construction of an embodiment of a modulating and demodulating device according to the invention.

FIG. 1 is a circuit diagram showing a construction of an embodiment of a modulating and demodulating device according to the invention and shows an example in which the modulating and demodulating device is applied to a transmitter-receiver of an on-vehicle device used for an automatic toll collection (ATC) system.

As shown in FIG. 1, the modulating and demodulating device of the embodiment comprises a microstrip line network 1, a modulator-demodulator 2, an FM decoder 3, a bias voltage supplying circuit 4, a control unit 5, a demodulation signal output terminal 6, and a transmitting/receiving antenna 7.

The microstrip line network 1 has a first microstrip line 8, a second microstrip line 9, and a third microstrip line 10. The modulator-demodulator 2 comprises a first diode 11, a second diode 12, a first inductor 13, a second inductor 14, a third inductor 15, a first resistor 16, a second resistor 17, a capacitor 18, a first bias voltage supplying terminal 23, and a second bias voltage supplying terminal 24. The bias voltage supplying circuit 4 has a first switch 19, a second switch 20, a third switch 21, and a power source 22.

In this case, in the microstrip line network 1, the input terminal is connected to the transmitting/receiving antenna 7 and the output terminal is connected to the input terminal of the modulator-demodulator 2. In the modulator-demodulator 2, the output terminal is connected to the input terminal of the FM decoder 3 and a control terminal is connected to the output terminal of the bias voltage supplying circuit 4. In the FM decoder 3, the output terminal is connected to the demodulation signal output terminal 6 and the control terminal is connected to the control unit 5. Control terminals of the bias voltage supplying circuit 4 are connected to the control unit 5.

In the microstrip line network 1, the first microstrip line 8 is serially connected between the input and output terminals, the second microstrip line 9 is connected between the input terminal and the ground terminal, and the third microstrip line 10 is connected between the output terminal and the ground terminal. In the modulator-demodulator 2, the first diode 11 is serially connected between the input and output terminals, the second diode 12 and the capacitor 18 are serially connected between the input terminal and the ground terminal, the first inductor 13 and the first resistor 16 are serially connected between the input terminal and the first bias voltage supplying terminal 23, the second inductor 14 is connected between the output terminal and the ground terminal, and the third inductor 15 and the second resistor 17 are serially connected between a connection point of the second diode 12 and the capacitor 18 and the second bias voltage supplying terminal 24. In the bias voltage supplying circuit 4, one terminal of the first switch 19 is connected to the second bias voltage supplying terminal 24 via the first output terminal, one terminal of the second switch 20 is connected via the second output terminal to the first bias voltage supplying terminal 23, the other terminal of the first switch 19, the other terminal of the second switch 20, and one terminal of the third switch 21 are connected, the other end of the third switch 21 is connected via the power source 22 to the ground terminal, and a control terminal of the first switch 19, a control terminal of the second switch 20, and a control terminal of the third switch 21 are connected to different control terminals of the control unit 5.

Figures 2, 3:
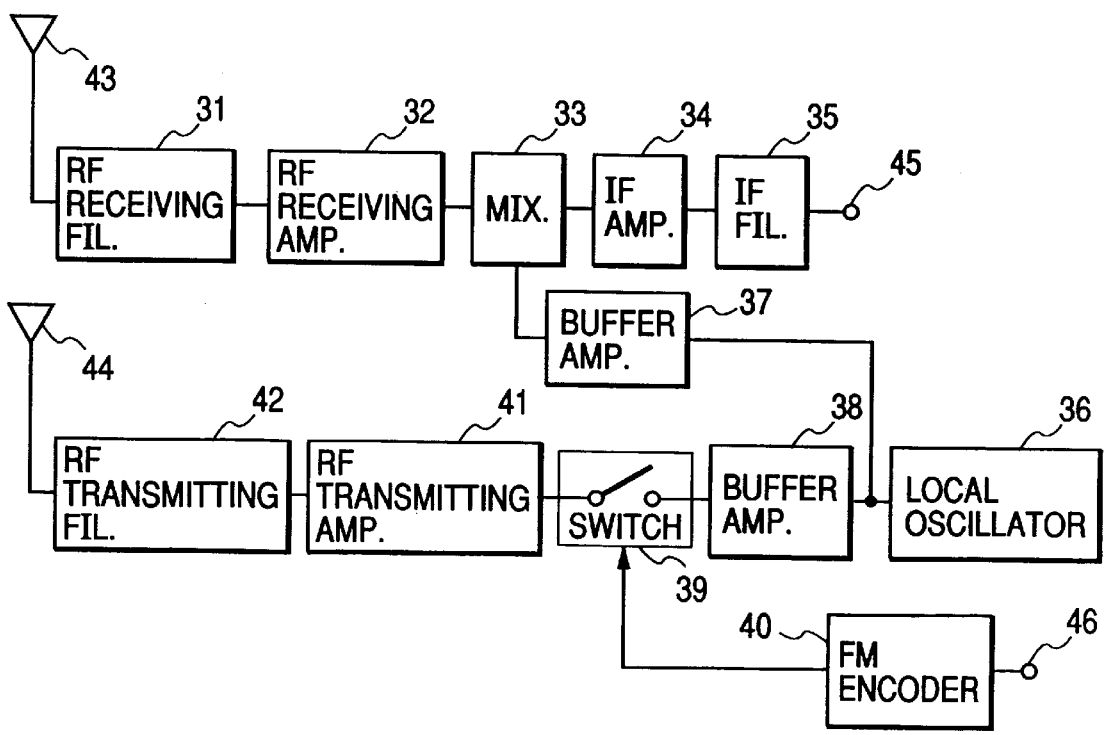
FIG. 2 is an explanatory diagram showing a list of the on/off states of switches, supply states of a bias voltage to bias voltage supplying terminals, and modulation/demodulation states in the modulating and demodulating device of the embodiment shown in FIG. 1.
FIG. 3 is a block diagram showing a construction of an important part of a roadside device for use in an automatic toll collecting system.
Figure 4:
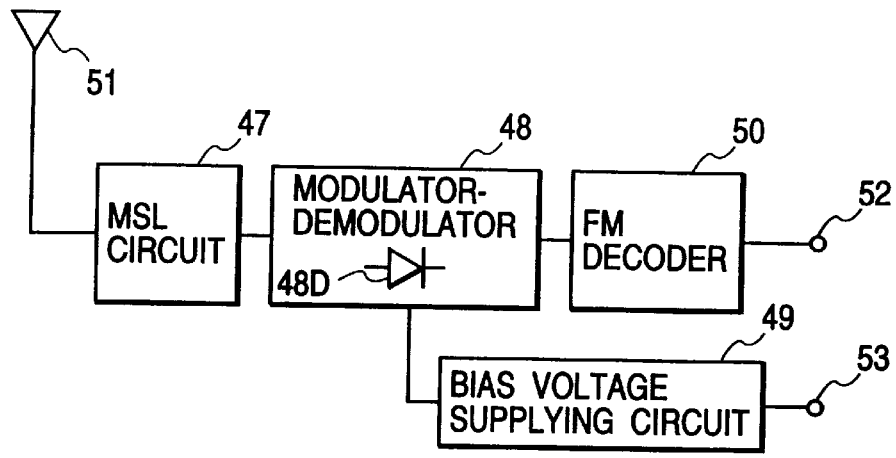
FIG. 4 is a block diagram showing a construction of an important part of an on-vehicle device for use in the automatic toll collecting system.
Figure 5:
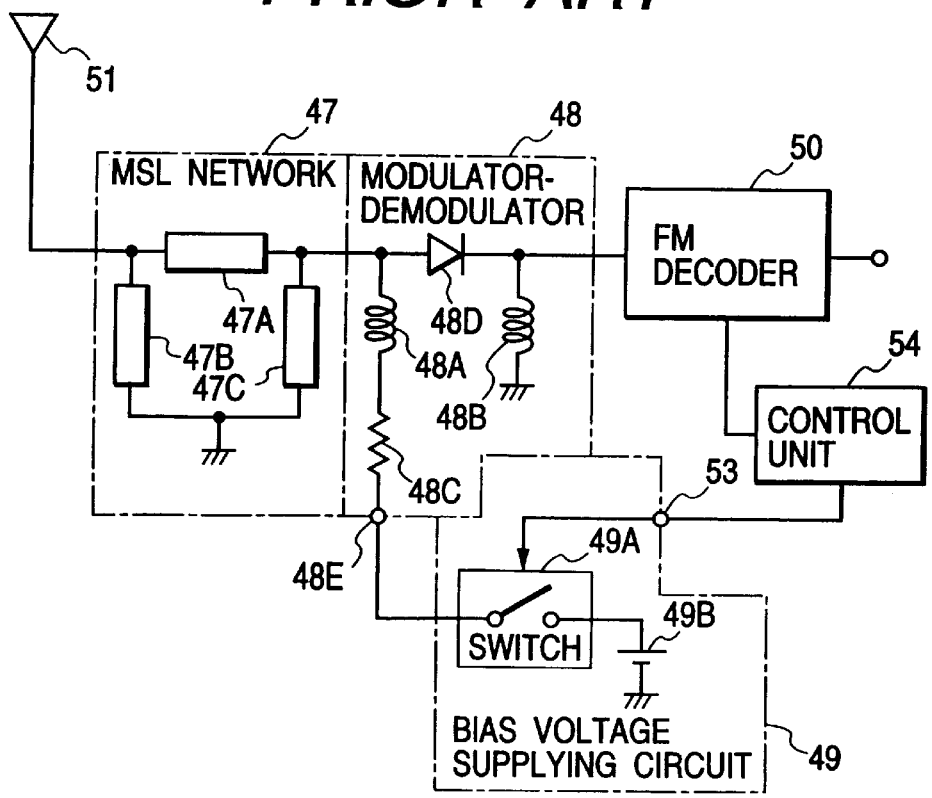
FIG. 5 is a circuit diagram showing an example of a specific circuit of a construction of the on-vehicle device shown in FIG. 4.

FIG. 2 is an explanatory diagram showing a list of the on/off state of each of the first to third switches 19 to 21, the supplying states of bias voltages to the first and second bias voltage supplying terminals 23 and 24, and the modulation/demodulation state in the modulating and demodulating device of the embodiment shown in FIG. 1.

The operation of the modulating and demodulating device of the embodiment having the above construction will be described hereinbelow with reference to FIG. 2 as well.

First, the operation in the first operating mode of transmitting the amplitude shift keying (ASK) modulated radio waves from the roadside device side, receiving the signal waves by the on-vehicle device side having the modulating and demodulating device of the embodiment, and executing the ASK demodulation to the radio waves will be described.

In the event of the first operating mode, a change-over signal is supplied from the third control terminal of the control unit 5 to the bias voltage supplying circuit 4. In the bias voltage supplying circuit 4, by the supply of the change-over signal, the third switch 21 is turned off as shown by the state A in FIG. 2. The voltage of the power source 22, for example, 5V is cut off by the third switch 21, so that the voltages at the first and second output terminals in the bias voltage supplying circuit 4, that is, the first and second bias voltage supplying terminals 23 and 24 in the modulator-demodulator 2 become zero bias voltage. The first diode 11 and the second diode 21 in the modulator-demodulator 2 also enter the zero bias state. At this moment, if the ASK modulated signal transmitted from the roadside device is received by the transmitting/receiving antenna 7, the reception signal is supplied via the microstrip line network 1 to the modulator-demodulator 2. An ASK modulated signal is demodulated by the first diode 11 in the zero bias state in the modulator-demodulator 2, thereby obtaining a demodulated signal. Then, the demodulated signal is supplied to the FM decoder 3. An encoded signal in the demodulated signal is decoded by the FM decoder 3 and the original signal is reproduced. The original signal is supplied to a not-shown adopted circuit via the demodulation signal output terminal 6.

The operation in the second operating mode of transmitting the carrier signal from the roadside device side, receiving the carrier signal by the on-vehicle device having the modulating and demodulating device of the embodiment, performing the phase shift keying (PSK) modulation to the received carrier signal, and transmitting the obtained PSK modulated signal will be described.

In the second operating mode, both a modulation signal which changes according to the binary modulation signals sent from the first and second control terminals of the control unit 5 and the change-over signal from the third control terminal of the control unit 5 are supplied to the bias voltage supplying circuit 4. By the supply of the modulation signals and the change-over signal, in the bias voltage supplying circuit 4, either the state B in FIG. 2 where the first switch 19 is ON, the second switch 20 is OFF, and the third switch 21 is ON, or the state C where the first switch 19 is OFF, the second switch 20 is ON, and the third switch 21 is ON is obtained. The switching between the states B and C is carried out according to the binary modulation signal. When the binary modulation signal has one of the values, the state is switched to B. When the binary modulation signal has the other value, the state is switched to C. In the state B, the voltage of the power source 22 of the bias voltage supplying circuit 4, for instance, 5V is supplied via the first switch 19 which is ON to the second bias voltage supplying terminal 24 and the voltage is cut off by the second switch 20 which is OFF and zero bias voltage is supplied to the first bias voltage supplying terminal 23. Consequently, the voltage of 5V from the second bias voltage supplying terminal 24 is applied as a forward bias voltage to the first diode 11 and the second diode 12, so that both the first and second diodes 11 and 12 are turned on. In the state C, the voltage of the power source 22 of the bias voltage supplying circuit 4, for example, 5V is supplied via the second switch 20 which is ON to the first bias voltage supplying terminal 23 and the voltage is cut off by the first switch 19 which is OFF so that zero bias voltage is supplied to the second bias voltage supplying terminal 24. Consequently, the voltage of 5V from the first bias voltage supplying terminal 23 is applied as a forward bias voltage only to the first diode 11, so that the first diode 11 is turned on and the second diode 12 is turned off.

At this moment, when the carrier signal transmitted from the roadside device is received by the transmitting/receiving antenna 7, the reception signal is supplied via the microstrip line network 1 to the modulator-demodulator 2. When the modulator-demodulator 2 is in the state B, that is, when the forward voltage of 5V is applied to the first and second diodes 11 and 12 and the first and second diodes 11 and 12 are ON, the carrier signal supplied to the modulator-demodulator 2 is totally reflected with the phase shift of 0° by the modulator-demodulator 2. on the other hand, when the modulator-demodulator 2 is in the state C, that is, when the forward voltage of 5V is applied to the first diode 11 and only the first diode 11 is ON, the carrier signal supplied to the modulator-demodulator 2 is totally reflected with the phase shift of 180° by the modulator-demodulator 2. Consequently, the carrier signal reflected by the modulator-demodulator 2 becomes a PSK modulation signal which has been PSK modulated. The obtained PSK modulation signal is transferred via the microstrip line network 1 to the transmitting/receiving antenna 7 and transmitted from the transmitting/receiving antenna 7.

As mentioned above, in the modulating and demodulating device of the embodiment, when the received radio waves including the ASK modulation signal are demodulated, the bias voltage generated by the bias voltage supplying circuit 4 is cut off to thereby turn off both the first and second diodes 11 and 12 in the modulator-demodulator 2, and the received ASK modulation signal is ASK demodulated by the first diode 11, thereby obtaining the ASK demodulation output. In case of modulating the received carrier signal, a predetermined bias voltage (for example, 5V) or zero bias voltage is generated from the bias voltage supplying circuit 4 in accordance with the binary modulation signal. According to the two bias voltages, switching is performed between the turn-on of the first and second diodes 11 and 12 in the modulator-demodulator 2 and the turn-on of only the first diode 11. The PSK modulation signal according to the switching of the ON states of the first and/or second diodes 11 and 12 is generated. The obtained PSK modulation signal is reflected by the modulator-demodulator 2 and transmitted. That is, the modulator-demodulator 2 is newly provided with the second diode 12 in addition to the first diode 11. At the time of demodulation of the signal waves, the second diode 12 as well as the first diode 11 are turned off. At the time of modulation of the signal waves, the switching is performed between the turn-on of both the first and second diodes 11 and 12 and the turn-on of only the first diode 11 in accordance with the binary modulation signal. At the time of demodulation of the signal waves, therefore, the power consumed by the first diode 11 when the ASK modulation signal is ASK demodulated is reduced, so that the high-efficient ASK demodulation can be realized. Moreover, at the time of modulation of the signal waves, the power consumed by the first and second diodes 11 and 12 when the PSK modulation is performed is reduced, so that the high-efficient PSK modulation can be realized.

Although the case where the modulating and demodulating device is applied to the transmitter-receiver of the on-vehicle device for use in the automatic toll collecting system has been described as an example in the foregoing embodiment, the modulating and demodulating device of the invention is not limited to the case where it is applied to the transmitter-receiver of the on-vehicle device for use in the automatic toll collecting system but can be also applied to a transmitter-receiver of other system as long as the transmitter-receiver is similar to the above-mentioned transmitter-receiver.

In the foregoing embodiment, the example in which the microstrip line network 1 comprises the three microstrip lines of the first to third microstrip lines 8 to 10 has been described. It will be obvious that the microstrip line network according to the invention is not limited to that comprising three microstrip lines but a microstrip line network including four or more microstrip lines can be also used.

Further, in the foregoing embodiment, the example in which the bias voltage generated by the bias voltage supplying circuit 4 is 5V has been described. The bias voltage generated by the bias voltage supplying circuit 4 according to the invention is not limited to 5V. It will be obvious that the bias voltage of a value other than 5V can be also used.

According to the invention as mentioned above, the modulator-demodulator is provided with the second diode in addition to the first diode. At the time of demodulation of the signal waves, both the first and second diodes are turned off. At the time of modulation of the signal waves, turn-on of the first and second diodes and the turn-on of only the first diode are switched in accordance with the binary modulation signal. Consequently, there are effects such that, at the time of demodulation of the signal waves, the power consumed by the first diode when the ASK modulation signal is demodulated is reduced, so that the high-efficient ASK demodulation can be carried out. At the time of modulation, the power consumed by the first and second diodes when the PSK modulation is executed is similarly reduced, so that the high-efficient PSK modulation can be performed.

What is claimed is:

1. A modulating and demodulating device comprising:
    a mirostrip line network connected to a transmitting/receiving antenna, a modulator-demodulator having a first diode and a second diode which are connected to an output of the microstrip line network, and a bias voltage supplying circuit for supplying a bias voltage selectively to the first diode and the second diode,
    wherein, in the modulator-demodulator, the first diode is serially connected between input and output terminals and the second diode is shunt-connected between the input terminal and a reference potential point, when the modulator-demodulator executes a modulating operation, the bias voltage supplying circuit supplies a bias voltage to turn on both the first and second diodes or a bias voltage to turn on only the first diode in accordance with a modulation signal, and when the modulator-demodulator performs a demodulating operation, the bias voltage supplying circuit supplies a bias voltage to turn off both the first and second diodes.

2. A modulating and demodulating device according to claim 1, wherein the modulating and demodulating device is used for an on-vehicle transmitter-receiver in an automatic toll collecting system.

* * * * *

UNITED STATES PATENT AND TRADEMARK OFFICE
CERTIFICATE OF CORRECTION

PATENT NO.    : 6,176,432 B1
DATED         : January 23, 2001
INVENTOR(S)   : Masao Miyaura It is certified that error appears in the above-identified patent and that said Letters Patent is hereby corrected as shown below:

Claim 1,
Line 2, change "mirostrip" to -- microstrip --.

Signed and Sealed this

Twenty-sixth Day of March, 2002

Attest:

JAMES E. ROGAN
Attesting Officer — Director of the United States Patent and Trademark Office